(12) United States Patent
Dannenmann et al.

(10) Patent No.: US 6,975,242 B2
(45) Date of Patent: Dec. 13, 2005

(54) METHOD AND APPARATUS FOR TRACKING REMOTE ENDS OF NETWORKING CABLES

(75) Inventors: John Dannenmann, Portland, OR (US); Ronald Helgerson, Gresham, OR (US)

(73) Assignee: Alan J. Brown, Chicago, IL (US)

( * ) Notice: Subject to any disclaimer, the term of this patent is extended or adjusted under 35 U.S.C. 154(b) by 39 days.

(21) Appl. No.: 10/360,882

(22) Filed: Feb. 7, 2003

(65) Prior Publication Data

US 2003/0222786 A1 Dec. 4, 2003

Related U.S. Application Data

(63) Continuation of application No. 09/460,775, filed on Dec. 14, 1999, now Pat. No. 6,577,243.

(51) Int. Cl.[7] .......................... G09F 9/33; G01R 19/00; G08B 5/22
(52) U.S. Cl. .................... 340/815.45; 324/66; 439/490; 370/241; 709/224
(58) Field of Search ...................... 340/815.45, 815.47, 340/596; 324/66, 67; 370/241, 248; 439/488–491, 439/620; 709/220, 213, 224, 230

(56) References Cited

U.S. PATENT DOCUMENTS

| | | | |
|---|---|---|---|
| 4,631,698 A | * | 12/1986 | Walsh et al. ............... 710/105 |
| 4,890,102 A | * | 12/1989 | Oliver ........................ 714/712 |
| 4,978,317 A | | 12/1990 | Pocrass ...................... 439/490 |
| 5,081,627 A | * | 1/1992 | Yu .............................. 714/46 |
| 5,249,183 A | | 9/1993 | Wong et al. ............... 370/85.3 |
| 5,428,671 A | | 6/1995 | Dykes et al. ................ 379/63 |
| 5,577,023 A | | 11/1996 | Marum et al. ............... 370/16 |
| 5,601,451 A | | 2/1997 | Driones et al. ............. 439/490 |
| 5,666,453 A | | 9/1997 | Dannenmann ............... 385/101 |
| 5,741,152 A | | 4/1998 | Boutros ....................... 439/490 |
| 5,764,043 A | | 6/1998 | Czosnowski et al. ......... 324/66 |
| 6,099,349 A | | 8/2000 | Boutros .................... 439/541.5 |
| 6,102,741 A | | 8/2000 | Boutros et al. ............. 439/490 |
| 6,577,243 B1 | * | 6/2003 | Dannenmann et al. .. 340/815.45 |

OTHER PUBLICATIONS

Kenney, Bob, "Back to Basics Understanding PTP Cabling", CBM, May, 1999, pp. 34-41.

* cited by examiner

Primary Examiner—Donnie L. Crosland
(74) Attorney, Agent, or Firm—Katten Muchin Rosenman LLP; John S. Paniaguas

(57) ABSTRACT

This specialized networking cable includes a plurality of twisted copper wire pairs encased in a flexible sheath for effectuating transmissive interconnections, electrically activated telltales affixed to both ends of the cable at positions adjacent to and connected to at least one of the copper wire pairs for providing an identification signal when activated; and means for selectively applying a current to the cable that activates the telltales and does not interfere with the flow of data through the cable whereby the telltales may be activated on at least one of the twisted copper pairs. An LED and an electric power connector suitable for plug-in connection of a power pack are affixed to the cable adjacent each end such that both LEDs are lighted whenever power is applied to either of the electrical connectors. The attendant illumination of the LEDs readily indicates where both ends of the networking cable are located. The networking cable also may be used for convenient telephonic communication by service personnel. One embodiment includes the cable as described above except with one end having a connector mateable with a standard Category 5 networking cable thereby providing for a standard networking cable to be converted into a specialized networking cable usable for tracing cable ends.

22 Claims, 7 Drawing Sheets

METHOD AND APPARATUS FOR TRACKING REMOTE ENDS OF NETWORKING CABLES

This application is a continuation of U.S. patent application Ser. No. 09/460,775 filed on Dec. 14, 1999 now U.S. Pat. No. 6,577,243, the entire contents of which are hereby incorporated by reference.

FIELD OF THE INVENTION

This invention relates to a method and apparatus for readily tracing remote connective portions of networking cables. It also provides a means for visually identifying the cabling from a computer workstation to a workstation panel and to a hub that connects the computer workstation to a server. This invention also includes a circuit that allows a light emitting diode (LED) to be connected across two pairs of interconnecting wire cable without disrupting those pairs for carrying data between the server and the workstation.

BACKGROUND OF THE INVENTION

The purpose of any networking cable is to carry data from one computer-related device to another. Computer-related devices include terminals, personal computers, printers, workstations, hubs, switches, storage devices, tape drives, and servers. Networking cables, frequently referred to as "jumper cables", "jumpers", or simply "cables", typically are multiple pair copper wires packaged in an outer flexible sheath. Networking cables are designed to interconnect a computer-related device with another computer-related device. Such networking cables often are used in systems where there are many networking cables connected to frames or panels, each of which may have many connecting cables and which may be located closely adjacent other similar panels, sometimes without carefully regimented management of the cables. The connections of each cable may be remote from one another, even being in separate rooms or spaces, whereby the networking cables may be of substantial length.

One example of such use of networking cables is in computer centers where it is often necessary to connect a networking cable from an individual workstation at one location with another networking cable from a computer server remote from the workstation. Further the interconnections sometimes are located in crowded and/or cramped quarters. Tracing and identifying a remote connector section or end of a specific cable for changing its connection in a network or to facilitate replacement often is difficult, tedious and time consuming, and can lead to errors which create further service problems and additional costs.

Various methods and systems have been developed for locating the ends of a networking cable. One such method is a trial and error process that requires personnel to use test equipment at both ends of each and every wire pair to identify the termination points. This process may be labor intensive and expensive. The second method is a variation of the first method and involves the use of equipment to send a tone on a wire pair and then detect a particular frequency at the termination point. This process is also labor intensive. Also, to determine termination points, the cable needs to be disconnected from the computers connected to the network. As a result, these methods interfere with performance and require the workstation to be taken out of service. In addition, both systems require the test person to walk from one end of a test point to the other end. If the workstation and server are located in separate rooms or in remote locations, the previous methods are labor intensive and inefficient for easy detection of termination ends.

In the telecommunications context, U.S. Pat. No. 5,666,453 discloses a specialized fiber optic jumper cable for tracing remote connective portions of a fiber optic cable which includes a composite fiber cable, fiber optic connectors, electrically powered light emitting devices at the connectors, and a pair of electrical conductors embedded in the cable, with one or more electrical power connectors for selectively applying an external electrical power source to the light emitting devices. An LED and an electric power connector suitable for plug-in connection of a power pack are affixed to the cable adjacent each end such that both LEDs are lighted whenever power is applied to either of the electrical connectors. The attendant illumination of the LEDs provides an indication that the tracer system is activated and functioning properly and readily indicates where both ends of the same jumper cable are located. The electrical conductors also may be used for convenient telephonic communication by service personnel.

There is a need for an improved mode of readily tracing networking cables to easily and accurately identify a remote portion, and particularly to identify a remote end.

SUMMARY

The present invention provides a method and apparatus for readily tracing networking cables. A networking cable having features of the present invention comprises a plurality of copper wire pairs encased in a flexible sheath for effectuating transmissive interconnections, electrically activated telltales affixed to both ends of the cable for providing an identification signal when activated, and means for selectively applying a current to the cable that activates the telltales. A power pack may be provided for applying a current through the electrical power controls so that upon application of the current the telltales are activated and the networking cable is visually identified. In a preferred embodiment of the present invention, the power pack provides for telephonic communication through the networking cable. Another embodiment of the present invention includes a networking cable as described above except with one end having a connector mateable with an eight conductor modular connector such that a standard networking cable may be converted into a networking cable usable for tracing cable ends.

While the invention will be further described in connection with certain preferred embodiments, it is not intended to limit the invention to those embodiments. On the contrary, it is intended to cover all alternatives, modifications and equivalents as may be included within the spirit and scope of the invention.

DETAILED DESCRIPTION OF A PREFERRED EMBODIMENT

Figure 1:
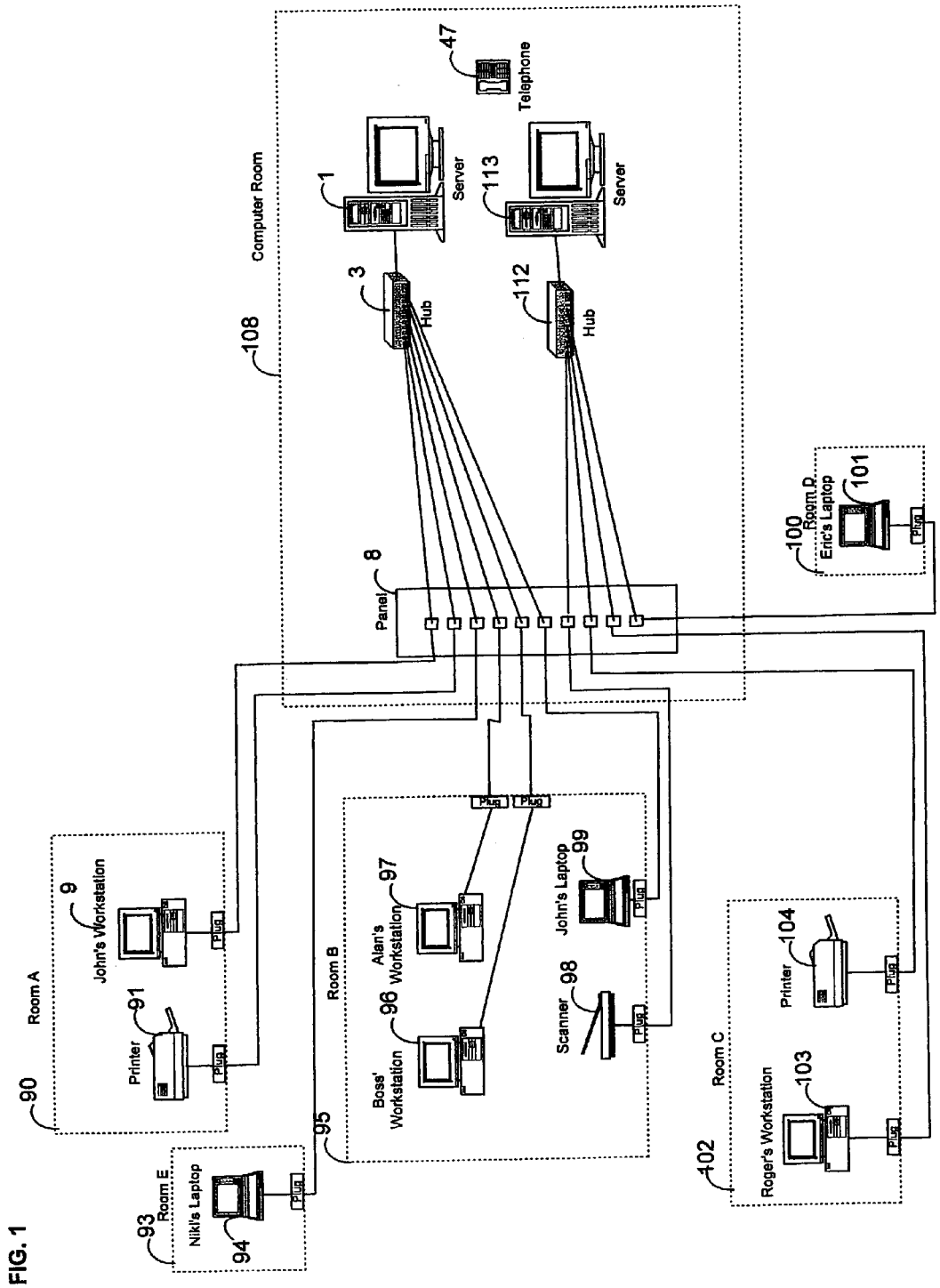
FIG. 1 is an illustration of a typical computer network employing the teachings of this invention.

FIG. 1 illustrates a typical multiple computer environment which includes a plurality of computer workstations 9, 96, 97 and 103, computer laptops 94, 99 and 101, and peripheral devices 91, 98, and 104 linked by networking cable to data hubs 3 and 112 and computer servers 1 and 113. Typically, a computer room 108 houses the computer servers 1 and 113 and data hubs 3 and 112 of the computer network. Located separately, such as in room A 90, room B 95, room C 102, room D 100, and room E 93, are the computer workstations and the various devices of network. Devices include computer equipment, printers, scanners, and terminals. Between the computer workstations 9, 96, 97, and 103 and the servers 1 and 113 is a workstation panel 8 that holds the networking cable. The workstation panel may be located in the computer room 108 or may be located in a separate location such as what is known as a "closet." From the workstation panel 8 networking cable is used to connect the computers 9, 96, 97 and 103 to a hub 3, and 112 of one the servers 1, and 113. A typical computer network may use Ethernet as the protocol to support data transfer between computer and server pairs. Data includes distinct pieces of information. Each computer workstation or computer laptop is associated with one particular computer server. For example, in FIG. 1, John's Workstation 9 may be supported by computer server 1 and John's Workstation 9 may communicate with computer server 1 by utilizing the Ethernet protocol.

Figure 2:
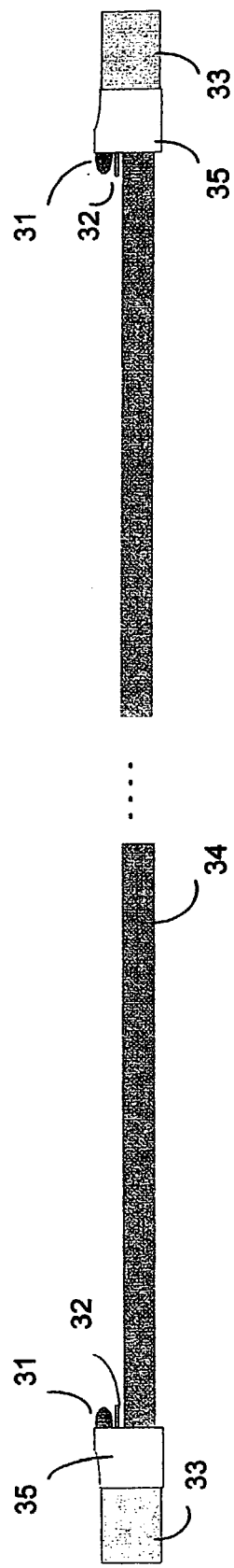
FIG. 2 is a schematic illustration of a networking cable employing teachings of this invention.
Figure 2A:
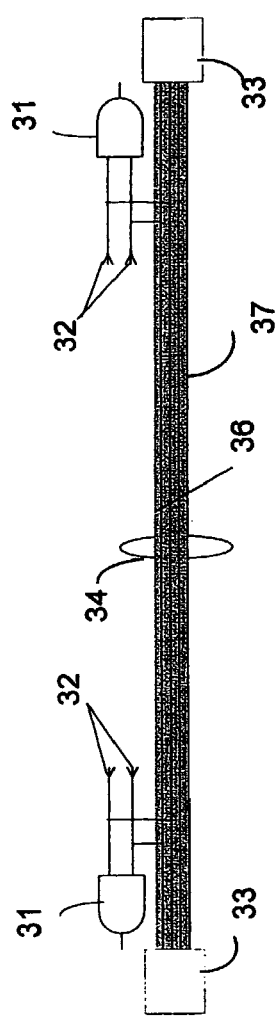
FIG. 2A is a schematic illustration of a networking cable as in FIG. 2.
Figure 3:
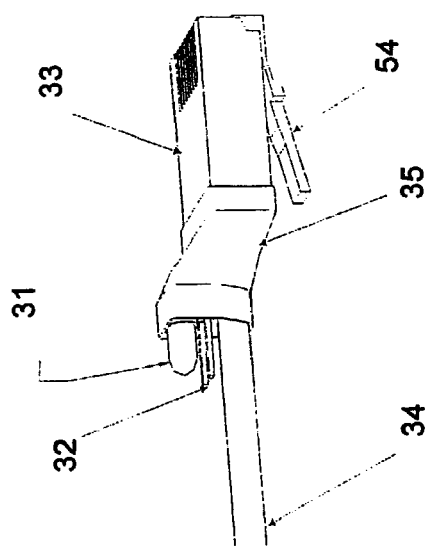
FIG. 3 is an enlarged view of the connector, telltale, and electric power connector of FIG. 2.
Figure 4:
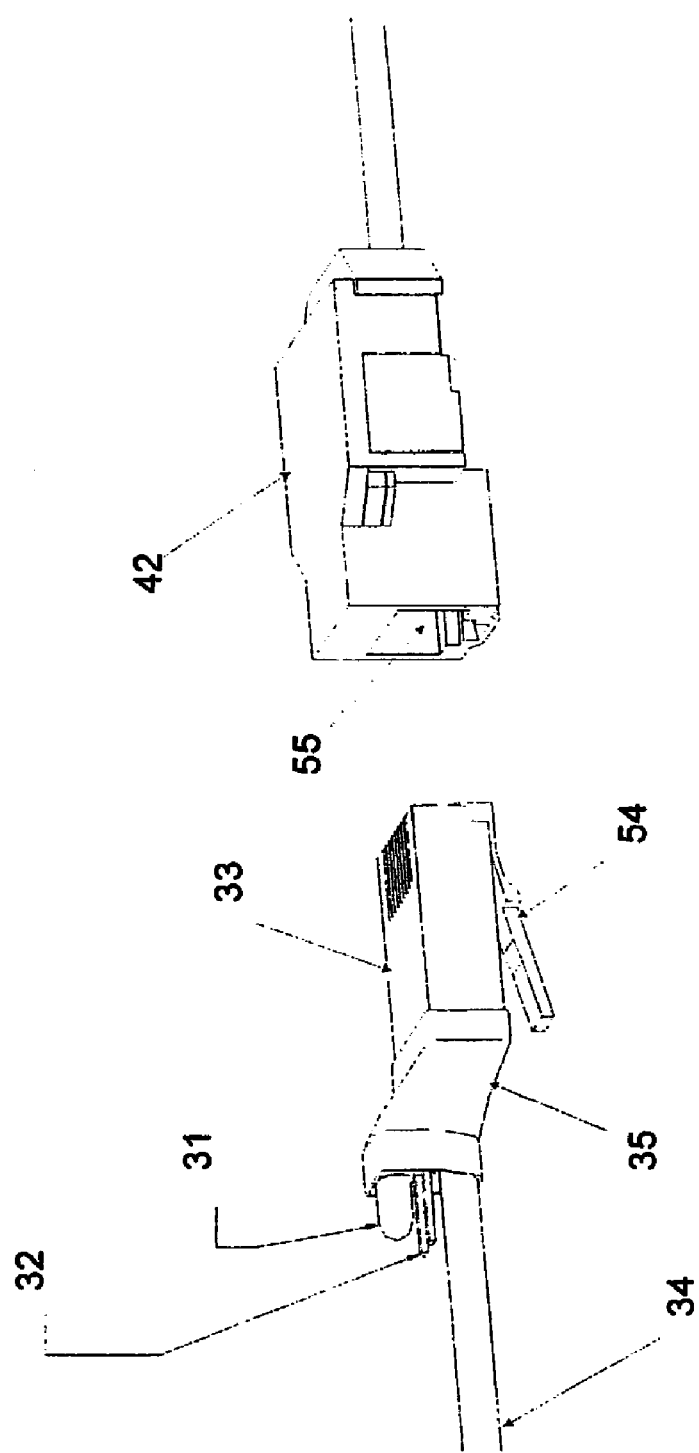
FIG. 4 is an enlarged view of the networking cable of FIG. 2 illustrating one end of the networking cable mating with a plug.
Figure 7:
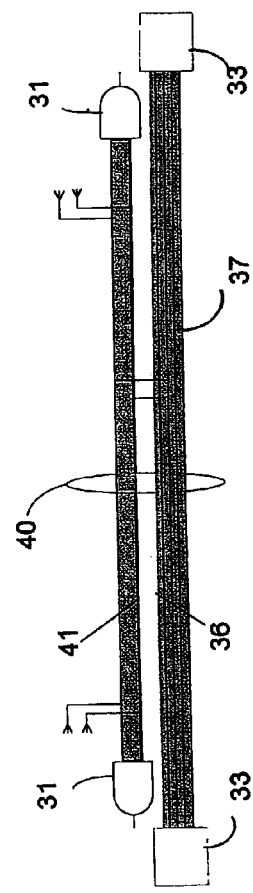
FIG. 7 illustrates an embodiment of the present invention wherein the networking cable 34 of FIG. 2 is replaced with a networking cable of five unshielded twisted copper pairs.

FIGS. 2–3 illustrate a networking cable which may be used in the computer environment of FIG. 1. The networking cable includes a composite cable 34 with a connector 33 at each end and an electrically operated telltale device 31 adjacent each of the connectors 33. The illustrated cable 34 includes four insulated twisted copper wires 36 encased in an outer cover jacket layer 37. In a preferred embodiment, the composite cable includes four copper wire pairs as is specified by Category 5 cabling standard, a Bellcore standard defined by an industry consortium. There may be more wire pairs for enhancement and/or protection of data transmission rates. In an embodiment of the invention as is illustrated in FIG. 7, five wire pairs are encased in the composite cable. In such an embodiment where five wire pairs are encased in the composite cable the networking cable is referred to as a "cablefinder" networking cable. Also, the composite cable may consist of coaxial, twinaxial, twisted, untwisted, shielded and unshielded pair wires, as is known in the art. Accordingly, the term "networking cable" is used in this description and in the appended claims to encompass all such variations of composite cable. Further, the various coating and covering components and variations thereof to form a basic networking cable are known in the networking cable art and will not be further described herein.

The illustrated telltale 31 is a light emitting diode (LED) mounted in a support block 35. A power connector also is provided immediately adjacent the LED and includes a pair of male contacts 32 for receiving appropriate plug prongs of a power source such as the battery pack unit 50 shown in FIG. 5.

Each of the electrical wires 36 is a small metallic electrical conductor, e.g. twisted copper pair, covered by a suitable insulation sheath. The wires 36 are embedded in the cable 34, preferably throughout its length at the time of manufacture of the cable. The electrical wires 36 are connected to the power connector 32 and to the telltales 31 such that upon applying electrical power through electrical wires 36, the telltales 31 are activated. Exposed end portions of the electrical wires 21,27 are physically and electrically connected to the leads 20,28 of the power connector 32 in any appropriate manner, for instance by being crimped in end portions of the power connector in a known manner or by other solderless termination techniques or by soldering. A flexible electrically insulated boot 35 surrounds the exposed ends of the wires 36 and the electrical interconnection with the telltales 31 and the power connector 32 to retain these components in assembled relation on the cable as well as to provide electrical insulation protection for the interconnections.

Figure 5:
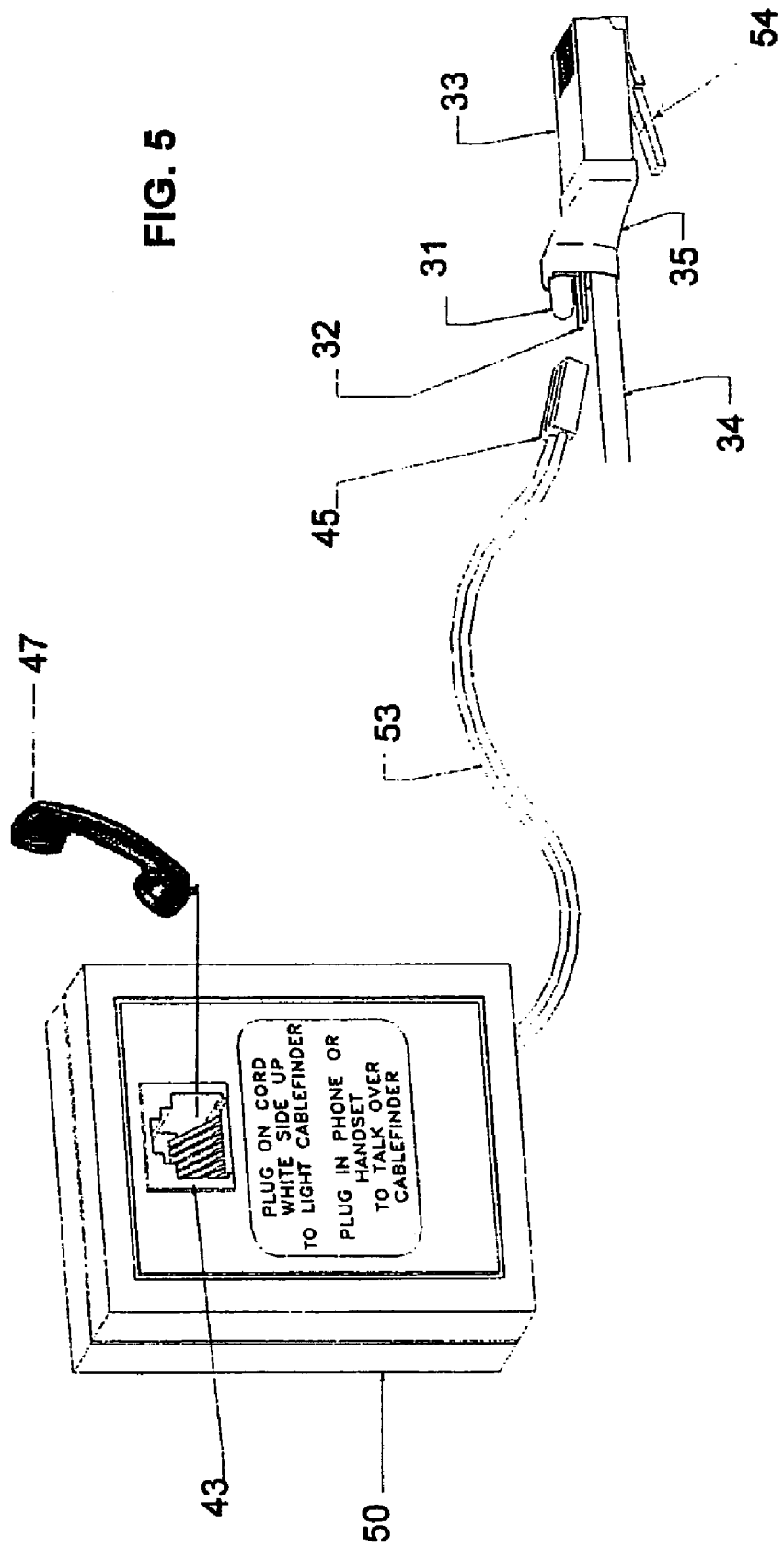
FIG. 5 is an illustration of a portable battery power source for activating the telltales of the networking cable of FIG. 2, and illustrating the inclusion of a telephonic device for communication over the networking cable.

Referring now to FIG. 3, the connectors are located on the ends of the length of the cable 34 and may be of any suitable design, such as six or eight conductor modular connectors. A type of six conductor modular connector that is used in Category 3, a Bellcore standard (as mentioned previously) defined by an industry consortium is the so-called RJ-11 connector. The illustrated connectors 33 are of the RJ45 type (an eight conductor modular connector), each comprising eight leads which are fixed in a housing. A latch 54 that is part of the housing includes an elongated locking mechanism for engaging a pin of a mating device 42 to effect a coupling affixation to such mating device 42. FIG. 5 illustrates such a situation. The right end of the connector 33, as seen in FIG. 5, illustrates a typical connector end for mating with a connector 42 and having a locking mechanism 54 for engaging in a slot 55 for retention purposes.

Figure 6:
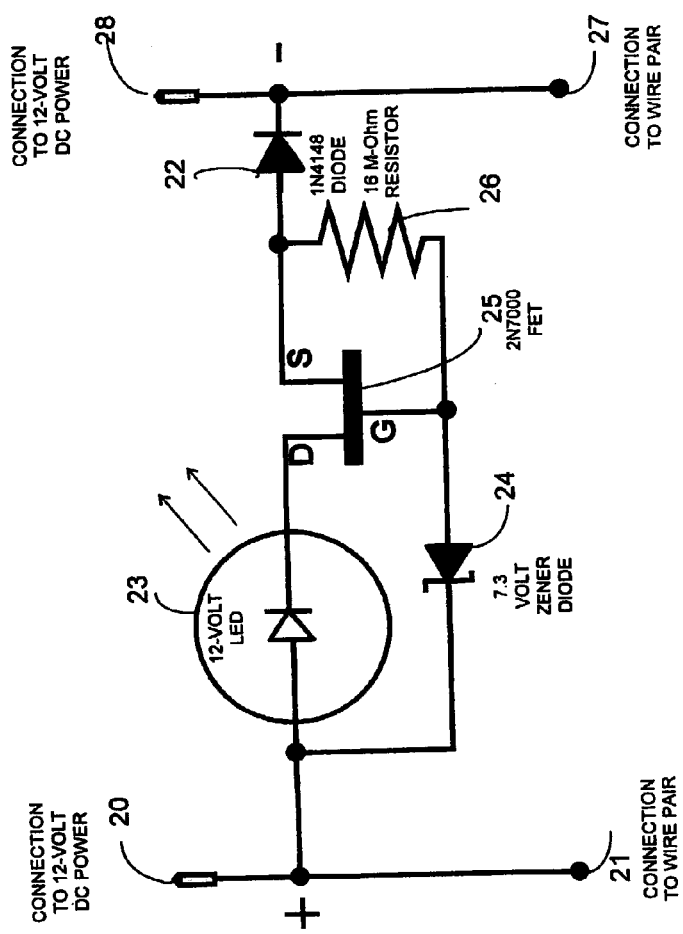
FIG. 6 is a schematic illustration of the indicator circuit used in the networking cable of FIG. 2.

Referring to FIG. 6, in a preferred embodiment of the invention, a networking cable indicator circuit is connected to two 21,27 of the four electrical wires 36. The DC inputs to the networking cable indicator circuit are connected across the third twisted wire pair 20,21 and the fourth twisted wire pair 27,28 of the networking cable. Although in a preferred embodiment, the third and fourth pairs are chosen, any two pairs may be used so that when power is not applied across the wires, data transmission is not affected. Further, in an illustrated embodiment as in FIG. 7, the networking cable indicator circuit may be connected to a fifth pair 41 so that when power is applied across the wires, data transmission is not affected. Such a preferred embodiment is called a "cable finder" networking cable.

The DC inputs to the networking cable indicator circuit are connected across two pairs (20, 21 and 27, 28) through a diode 22, light emitting diode (LED) 23, CMOS switching field effect transistor (FET) 25, zener diode 24, and resistor 26 which together implement the indicator circuit. A device suitable for use as a CMOS switching FET is available as model 2N7000 from Motorola Corp. of Santa Clara, Calif. A device suitable for use as a diode is available as model 1N4148 from Motorola of Phoenix, Ariz. Any suitable low current diode with a reverse breakdown higher than any expected voltage is suitable for the indicator circuit. Further, a preferred embodiment includes a 12-volt LED, a 7.3-Volt zener diode and a 16 M Ohm resister.

The indicator circuit is described as a high impedence LED-FET circuit. The indicator circuit is in a high impedance state if normal data transmission takes place. Normal data transmissions are defined by the Category 5 standard to take place at less than 7-Volts. For the Category 5 standard, when the voltage across the transmission wires 36 is less than 7 volts, then the indicator circuit appears to be invisible to data transmission and the impedance across the circuit is high. Whenever the voltage across the indicator circuit is greater than 7 volts, current flows through the circuit and the impedance across the circuit is low. A voltage greater than 7 will cause the FET to break down and the current to flow to light the LED.

The indicator circuit of FIG. 6 is designed so that when a higher voltage then the normal voltage (7-Volts for Category 5) on the wires 36 is placed across the wires (20, 21 and 27, 28), then the circuit is in a low impedance state. If the voltage across the pair exceeds 7-Volts, then the impedance goes to the impedance of the LED, which is relatively low. In terms of current, the current flow across the LED at 12 volts is about 10 mA which is sufficient to illuminate the LED. Conversely, in the high impedance state, the current flow across the LED at less than the normal voltage of 7-Volts, is less than 10 uA. Although the circuit was designed for the normal voltage of 7-Volts, any pre-selected level may be chosen. Thus, an indicator circuit that is designed for a normal voltage of less than 7-Volts is considered to be equivalent. An equivalent circuit is any circuit that goes across those wires which does not allow significant current flow until you have applied an outside stimulus such as a 12-Volt power supply.

In a preferred embodiment, a FET is used to perform the switching function of turning on when the voltage is greater than the preselected level of 7-Volts. A switching relay, a programmable gate array or a programmable digital computer may perform this function. Such various switching elements and variations thereof are known in the computer art and will not be further described herein.

In a preferred embodiment, a 12-Volt LED and 12-Volt technology is used. This allows 12 volts to be available for the telephone. Further, the various LED, resistor, and current limiting diode combinations are known in the art and will not be further described herein. In an embodiment of the invention where the handset for the telephone talk circuit is not necessary, less than 12-Volt technology may be used in place of the 12-Volt technology. Further, using a higher voltage technology, such as 15-Volt LEDS or 24-Volt LEDS is also possible.

Figure 8:
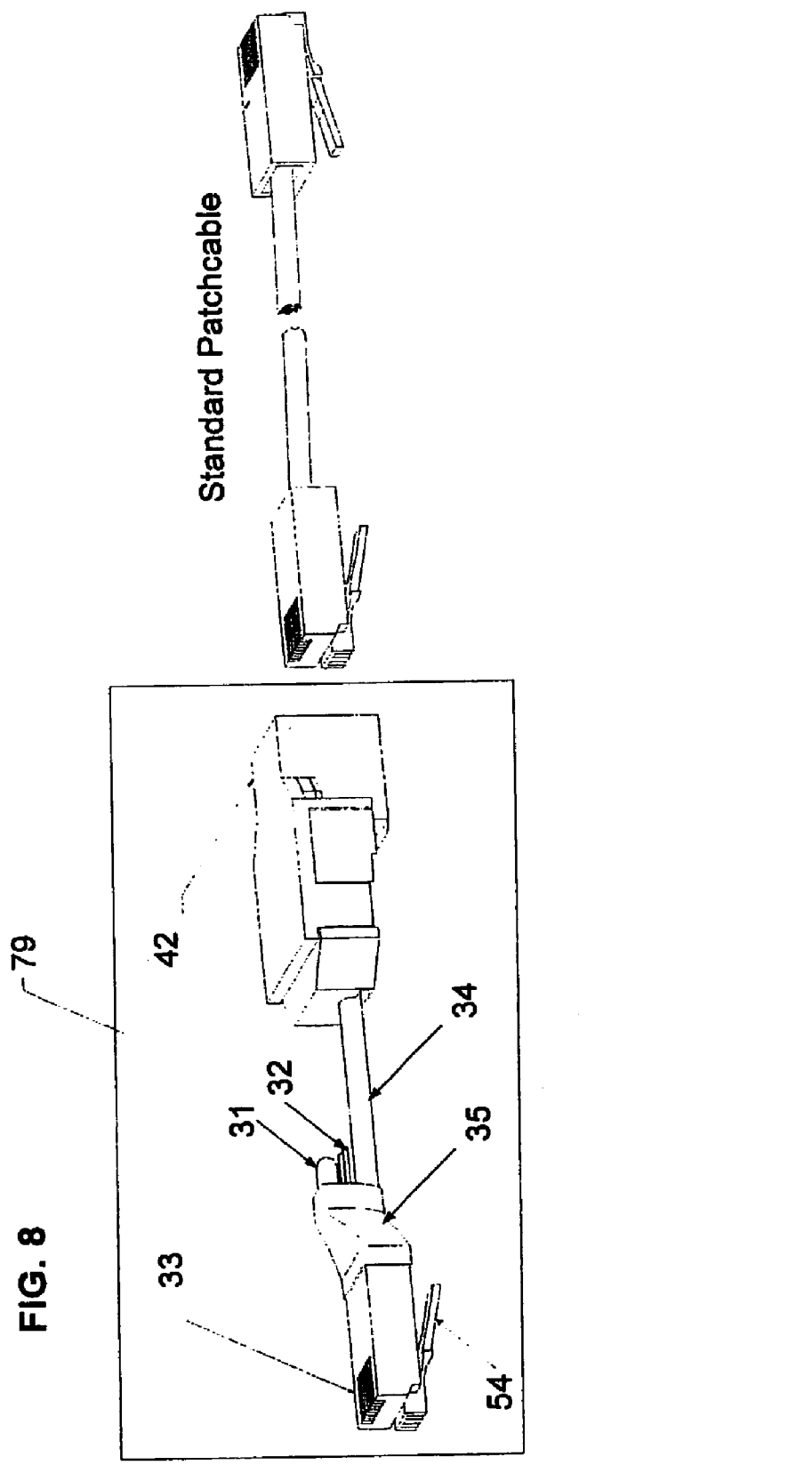
FIG. 8 illustrates an embodiment wherein a networking cable adapter embodies the teachings of the present invention.

In another embodiment of the present invention, in place of the indicator circuit of FIG. 6, an LED 31 and power connector pins 32 are directly connected to the fifth pair 41 of transmission wires as illustrated in FIG. 8. This fifth pair 41 provides the tracing feature of the networking cable without interfering with data transmissions.

Figure 9:
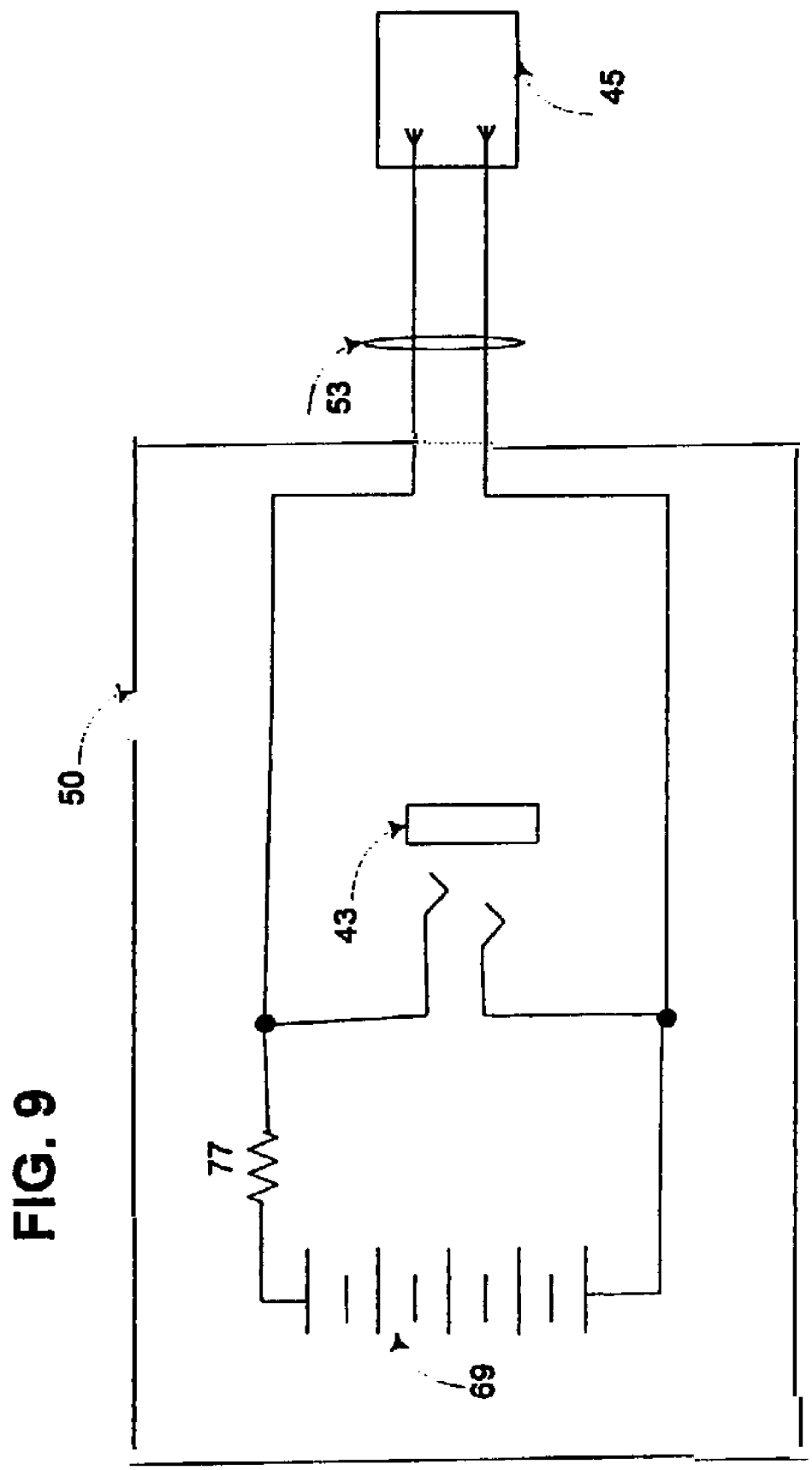
FIG. 9 illustrates an electrical power circuit of the power pack 50 in FIG. 5.

Referring to FIG. 5, a battery pack 50 includes a drycell battery, e.g. 12 volts, in a housing. The battery is suitably connected to a pair of external leads in a short, e.g. 8" flexible cable 53 which carries a power plug connector 45 that is mateable with the contacts 31. The pack 50 also supplies 12-Volt DC power to the jack 43 of telephonic device 47. Referring to FIG. 9 for example, the battery pack circuitry includes a 12-Volt DC battery 69, a 600 ohm ¼ watt resistor 77, a RJ11 jack 43 and a connecting cord 53 with 0.025 pin connector 45. In another arrangement, in place of the battery 69, a 15-Volt DC power supply may be provided which operates from a standard electrical outlet (typically on a wall) and connects to the battery pack. In yet another arrangement, a power supply may be provided which operates from a conventional 120-Volt AC power circuit which generates a DC power output. Accordingly, the term power pack is used in this description and in the appended claims to encompass all such variations of power packages.

Whether powered by an internal battery or using external power, the power pack preferably is portable for movement from work station to work station, and may be hand held or temporarily mounted adjacent a frame or panel such as by a clip or Velcro® securement. However, the power pack also may be a fixed installation, such as for panels and racks which serve a large number of networking cables. The leads 32 may be fixed to the power pack or may be patchcords, particularly in installations which include a fixed power pack, and may be free cords or may be mounted on automatic take-up reels or other forms of automatic returns.

Upon applying electrical power to the wires 36, as by the simple act of plugging in the battery power pack 50 to a power connector 32, the LED telltales 31 will be lighted. For example, a user who has identified one connector end of a computer network networking cable to be traced may plug the power pack into the conveniently adjacent power connector 32. The attendant illumination of the adjacent LED will signal that the telltale tracer system is operating. The user then seeks a correspondingly illuminated and hence readily visible telltale at another location to readily locate and identify the other terminal end. Further, in a multiple computer network interconnected by networking cables of the present invention, plugging the power pack into the power connector near a computer workstation will correspondingly illuminate the corresponding LEDs at a patchpanel 8, attached networking cables and associated computer server 1. Further, in a multiple computer network interconnected by networking cables of the present invention, electrical power may be applied by pressing a soft-key or function key on a keyboard of the workstation 9 will correspondingly illuminate the corresponding LEDs at a patchpanel 8, attached networking cables and associated computer server 1. The workstation may be wired so that pressing a soft key will provide electrical power to the networking cable. For example, a computer technician in a remote computer room 108 may call John at his workstation and ask him to press <F12> on the keyboard so that the corresponding LED at the server in the computer room 108 will be lit.

It will be appreciated that various telltale devices may be utilized, including for example conventional small light bulbs or liquid crystal or electro-mechanical indicators suitably mounted in the desired positions along the cable 34, wherever ease of identification is desired. For example, a light bulb or liquid crystal visual indicator may be substituted for each LED in a system as described with reference to FIGS. 2–8. One example of an electro-mechanical device such as may be used is a "Faranti Indicator", which has a movable disk that exposes either a flat black surface or a bright contrasting surface to the viewer as the device is subjected to successive electromagnetic pulses. The use of LEDs presently is preferred for simplicity and ruggedness. Further, different color telltale devices may be utilized for ease of identification. For example, a red colored LED may be used to signify an important computer connection that may not be disturbed.

Providing telltales and power connections separate from the connectors permits use of the system in networking cables using any type of cable connectorization. Also, the relative positions and orientation of the telltale and the power connector may be varied.

Referring now to FIG. 8, in an embodiment of the present invention an adapter is provided so that existing networking cables may be modified to provide the tracing feature. Such an adapter may be termed a "portfinder" adapter. Adapter 79 consists of the RJ45 mateable connector 42, composite cable 34 with attendant electrically activated telltales 31, RJ45 connector 33 as illustrated in FIG. 1 and indicator circuit as illustrated in FIG. 6. The RJ45 mateable connector 42 connects to so called standard "patchcables" or "jumpers". A computer network that is fully connected using standard "patchcables" or "jumpers" may be converted to the networking cable of this invention by using the adapter 79. Further, the adapter 79 provides for the tracing feature to a computer workstation, such as workstation 9 in FIG. 1. When adapter 79 is attached to an existing standard patchcable and power is applied to power pins 32, attached networking cables of this invention will illuminate. The cablefinder adapter allows for tracing of remote ends of cables from a computer workstation to a computer server.

The use of a portable plug-in battery pack provides a simple, flexible and cost-effective approach to powering and selectively activating the telltales. For example, the pack 50 of FIG. 5 may be clipped to a service person's belt for convenient use at any location. However, in some installations power may be supplied from fixed outlets associated with the cross connect system hardware which uses the networking cables, with voltage and current control provisions suitable to the electrical conductors and telltale devices being utilized. Electrical switches then may be provided at convenient locations, in lieu of the power connectors 32, for activating one or more of the telltales along a cable. An "alert" signal means, such as a sound emitting device, may be added at some or all indicator positions for activation by the same internal electrical signal power system simultaneously with activation of the visual indicators. This will serve to alert a worker to look for an activated visual telltale.

As indicated in FIGS. 5 and 9, the internal electrical conductors 36 also may serve for telephonic communication, such as between service personnel at positions remote from one another, in the manner of so-called "order wires" heretofore provided in wiring cables in telephone communications systems. Appropriate telephone jack sockets 43 may be provided at the respective positions, such as in association with the power connectors 32 or preferably in the power pack 50, to receive the jacks of telephonic device 47.

Further, a method of finding computer workstation and computer server/hub pairs is disclosed. However, it will be appreciated that this method may be used to find any device at the end of a networking cable. For example, a printer connected via networking cable may be located by use of this method.

The invention has been described in considerable detail with reference to certain embodiments, and particularly with respect to the currently preferred embodiments thereof. However, it will be understood that variations, modifications and improvements may be made, particularly by those skilled in this art and in light of the teachings referred to herein within the spirit and scope of the invention as claimed.

What is claimed is:

1. A networking cable for transmitting nominal signals, the networking cable comprising:
    a plurality of twisted copper wire pairs;
    at least one electrically activated indicator affixed to at least one end of at least one pair of said plurality of twisted copper wire pairs for providing an indication in response to an illumination signal; and
    a driver for generating an illumination signal whenever signals other than said nominal signals are applied to said at least one pair of said plurality of twisted copper wire pairs, said driver configured so as to not interfere with the flow of data through the cable, said driver and said indicator coupled to at least one of said twisted copper wire pairs.

2. The networking cable as recited in claim 1, wherein the twisted copper pairs are capable of transmitting data between two computer-related devises.

3. The networking cable as recited in claim 1, wherein the indicator provides a visible signal when activated.

4. The networking cable as recited in claim 1, wherein the indicator includes light emitting devices or light emitting diodes.

5. An indicator circuit for transmitting nominal signals between two devices electrically coupled by a networking cable having at least one pair of twisted copper wires, the circuit comprising:
    an indicator for providing an indication of a cable connection between said two devises; and
    an electrically activated switch coupled across said at least one pair of twisted copper wires for energizing said indicator when signals other than said nominal signals are applied to the circuit.

6. An indicator circuit for signaling a cable connection between two devices electrically coupled by a networking cable having at least one pair of wires for transmitting nominal signals, the indicator circuit comprising:
    an impedance circuit adapted to be connected across said at least one pair of wires and configured to provide a relatively high impedance between said pair of wires when signals other than said nominal signals are applied to the circuit; and
    an indicator for indicating when signals other than said nominal signals are applied to said pair of wires.

7. A networking cable for transmitting data comprising:
    at least one pair of twisted copper wires for carrying nominal signals;
    an indicator affixed to at least one end of said at least one pair of twisted copper wires which illuminates in response to an illumination signal; and
    a driver circuit for generating an illumination signals when signals other than said nominal signal are applied to said at least one pair of twisted copper wires.

8. An apparatus for detecting computer connections comprising:
    a networking cable comprising at least one pair of twisted copper wires for transmitting nominal signals, at least one electrically activated indicator affixed to at least one end of said at least one pair of twisted copper wires, said electrically activated indicator adapted to illuminate in response to an illumination signal; and a drive circuit for generating said illumination signal when signals other than said nominal signals are applied to said at least one pair of twisted copper wires; and
    a removable power pack for applying power to said at least one of said twisted copper pairs.

9. The apparatus as recited in claim 8 wherein the power pack includes electrical power sources, power supplies, and portable electric battery packs.

10. The apparatus as recited in claim 9 wherein the electrical power sources may be activated by a computer workstation soft key.

11. The apparatus as recited in claim 9 wherein the power pack comprises a mating connector compatible with the electric power connector.

12. The apparatus as recited in claim 9 wherein the power pack includes means for connecting a telephone to the plurality of twisted copper pairs for affecting telephonic communications along the twisted copper pairs.

13. The apparatus as recited in claim 9 in combination with a telephone unit selectively connectable to the twisted copper pairs through the power pack.

14. In a multiple computer environment, a method for determining connections comprising the steps of:
   providing networking cables having at least one pair of twisted copper wires for transmitting nominal signals;
   providing at least one indicator electrically coupled to said at least one end of said at least one pair of twisted copper wires
   selectively applying signals other than said nominal signals to the networking cable to activate said at least one indicator; and
   observing the activated indicator.

15. The method recited in claim 14 and including communicating over the twisted copper pairs.

16. The computer networking cable indicator for providing an indication of signals other than nominal signals being applied to a pair of wires, comprising:
   an electrically activated indicator which provides an indication in response to an illumination signal;
   a driver for generating said illumination signal when signals other than said nominal signals are applied to said pair of wires.

17. The indicator recited in claim 16 wherein the driver includes one device selected from the group of a transistor switching relay, a programmable gate array or a programmable digital computer.

18. The indicator recited in claim 16 wherein the driver is in a low impedance state when the voltage is greater than 7-Volts and the indicator is activated.

19. The indicator recited in claim 16 wherein the indicator includes one device selected from the group one of a light emitting diode, liquid crystal visual indicator, Faranti indicator, or conventional light bulb.

20. The indication circuit for indicating the presence of signals other than nominal signals in a cable having at least one pair of copper wires, the indication circuit comprising:
   an indicator for indicating the presence of signals other than nominal signals being applied to at least one pair of copper wires in response to an illumination signal; and
   a driver circuit for generating said illumination signal when signals other than nominal signals are applied to said at least one pair of copper wires.

21. The indication circuit as recited in claim 20 wherein said indication circuit is mounted at a location other than said connectors.

22. The indication circuit as recited in claim 20, wherein said driver circuit includes a Zener diode.

* * * * *